US008608348B2

(12) United States Patent
Maxik et al.

(10) Patent No.: US 8,608,348 B2
(45) Date of Patent: Dec. 17, 2013

(54) SEALED ELECTRICAL DEVICE WITH COOLING SYSTEM AND ASSOCIATED METHODS

(75) Inventors: Fredric S. Maxik, Indiatlantic, FL (US); David E. Bartine, Cocoa, FL (US); Robert R. Soler, Cocoa Beach, FL (US); Ran Zhou, Melbourne, FL (US); Addy S. Widjaja, Palm Bay, FL (US); Valerie A. Bastien, Melbourne, FL (US); Mark Andrew Oostdyk, Cape Canaveral, FL (US)

(73) Assignee: Lighting Science Group Corporation, Satellite Beach, FL (US)

( * ) Notice: Subject to any disclaimer, the term of this patent is extended or adjusted under 35 U.S.C. 154(b) by 0 days.

(21) Appl. No.: 13/461,333

(22) Filed: May 1, 2012

(65) Prior Publication Data

US 2013/0021802 A1 Jan. 24, 2013

Related U.S. Application Data

(63) Continuation-in-part of application No. 13/107,782, filed on May 13, 2011.

(51) Int. Cl.
*F21V 29/00* (2006.01)
*H05K 7/20* (2006.01)

(52) U.S. Cl.
USPC ............................ 362/294; 362/158; 362/373

(58) Field of Classification Search
USPC .......................................... 362/294, 373, 158
See application file for complete search history.

(56) References Cited

U.S. PATENT DOCUMENTS

| | | | |
|---|---|---|---|
| 5,057,908 | A | 10/1991 | Weber |
| 5,523,878 | A | 6/1996 | Wallace et al. |
| 5,704,701 | A | 1/1998 | Kavanagh et al. |
| 5,997,150 | A | 12/1999 | Anderson |
| 6,140,646 | A | 10/2000 | Busta et al. |
| 6,341,876 | B1 | 1/2002 | Moss et al. |
| 6,356,700 | B1 | 3/2002 | Strobl |

(Continued)

FOREIGN PATENT DOCUMENTS

WO WO 2009/040703 4/2009

OTHER PUBLICATIONS

Arthur P. Fraas, Heat Exchanger Design, 1989, p. 60, John Wiley & Sons, Inc., Canada.

(Continued)

*Primary Examiner* — Stephen F Husar
*Assistant Examiner* — James Cranson, Jr.
(74) *Attorney, Agent, or Firm* — Mark R. Malek; Daniel C. Pierron; Zeis Widerman & Malek

(57) ABSTRACT

An electrical device and method are presented, the device having an enclosure defining an interior volume sealed from the environment and an electronic lighting apparatus, which may include a heat generating element such as a light source, a heat sink, and a fluid flow generator, and optionally a support offsetting the fluid flow generator form the heat sink. The heat sink may be positioned adjacent the heat generating element and transfer heat there from. The fluid flow generator may create a flow of fluid to transport heat away from the heat sink and to the enclosure. The electronic lighting apparatus may be carried by the enclosure and partially disposed within the interior volume of the enclosure. The electrical device may further include an optic carried by the enclosure.

50 Claims, 4 Drawing Sheets

(56) References Cited

U.S. PATENT DOCUMENTS

| | | | |
|---|---|---|---|
| 6,561,656 | B1 | 5/2003 | Kojima et al. |
| 6,594,090 | B2 | 7/2003 | Kruschwitz et al. |
| 6,733,135 | B2 | 5/2004 | Dho |
| 6,767,111 | B1 | 7/2004 | Lai |
| 6,817,735 | B2 | 11/2004 | Shimizu et al. |
| 6,870,523 | B1 | 3/2005 | Ben-David et al. |
| 6,871,982 | B2 | 3/2005 | Holman et al. |
| 6,964,501 | B2 * | 11/2005 | Ryan ............................ 362/294 |
| 6,967,761 | B2 | 11/2005 | Starkweather et al. |
| 6,974,713 | B2 | 12/2005 | Patel et al. |
| 7,042,623 | B1 | 5/2006 | Huibers et al. |
| 7,070,281 | B2 | 7/2006 | Kato |
| 7,072,096 | B2 | 7/2006 | Holman et al. |
| 7,075,707 | B1 | 7/2006 | Rapaport et al. |
| 7,083,304 | B2 | 8/2006 | Rhoads |
| 7,178,941 | B2 | 2/2007 | Roberge et al. |
| 7,184,201 | B2 | 2/2007 | Duncan |
| 7,246,923 | B2 | 7/2007 | Conner |
| 7,255,469 | B2 | 8/2007 | Wheatley et al. |
| 7,261,453 | B2 | 8/2007 | Morejon et al. |
| 7,289,090 | B2 | 10/2007 | Morgan |
| 7,300,177 | B2 | 11/2007 | Conner |
| 7,303,291 | B2 | 12/2007 | Ikeda et al. |
| 7,325,956 | B2 | 2/2008 | Morejon et al. |
| 7,342,658 | B2 | 3/2008 | Kowarz et al. |
| 7,344,279 | B2 | 3/2008 | Mueller et al. |
| 7,349,095 | B2 | 3/2008 | Kurosaki |
| 7,353,859 | B2 | 4/2008 | Stevanovic et al. |
| 7,382,091 | B2 | 6/2008 | Chen |
| 7,382,632 | B2 | 6/2008 | Alo et al. |
| 7,400,439 | B2 | 7/2008 | Holman |
| 7,427,146 | B2 | 9/2008 | Conner |
| 7,429,983 | B2 | 9/2008 | Islam |
| 7,434,946 | B2 | 10/2008 | Huibers |
| 7,438,443 | B2 | 10/2008 | Tatsuno et al. |
| 7,476,016 | B2 | 1/2009 | Kurihara |
| 7,520,642 | B2 | 4/2009 | Holman et al. |
| 7,530,708 | B2 | 5/2009 | Park |
| 7,537,347 | B2 | 5/2009 | Dewald |
| 7,540,616 | B2 | 6/2009 | Conner |
| 7,556,406 | B2 | 7/2009 | Petroski et al. |
| 7,598,686 | B2 | 10/2009 | Lys et al. |
| 7,605,971 | B2 | 10/2009 | Ishii et al. |
| 7,626,755 | B2 | 12/2009 | Furuya et al. |
| 7,677,736 | B2 | 3/2010 | Kasazumi et al. |
| 7,684,007 | B2 | 3/2010 | Hull et al. |
| 7,703,943 | B2 | 4/2010 | Li et al. |
| 7,709,811 | B2 | 5/2010 | Conner |
| 7,719,766 | B2 | 5/2010 | Grasser et al. |
| 7,766,490 | B2 | 8/2010 | Harbers et al. |
| 7,819,556 | B2 | 10/2010 | Heffington et al. |
| 7,828,453 | B2 | 11/2010 | Tran et al. |
| 7,828,465 | B2 | 11/2010 | Roberge et al. |
| 7,832,878 | B2 | 11/2010 | Brukilacchio et al. |
| 7,834,867 | B2 | 11/2010 | Sprague et al. |
| 7,835,056 | B2 | 11/2010 | Doucet et al. |
| 7,845,823 | B2 | 12/2010 | Mueller et al. |
| 7,883,241 | B2 * | 2/2011 | Ho .......................... 362/249.02 |
| 7,889,430 | B2 | 2/2011 | El-Ghoroury et al. |
| 7,928,565 | B2 | 4/2011 | Brunschwiler et al. |
| 7,976,205 | B2 | 7/2011 | Grotsch et al. |
| 8,016,443 | B2 | 9/2011 | Falicoff et al. |
| 8,047,660 | B2 | 11/2011 | Penn et al. |
| 8,061,857 | B2 | 11/2011 | Liu et al. |
| 8,070,302 | B2 | 12/2011 | Hatanaka et al. |
| 8,070,324 | B2 | 12/2011 | Kornitz et al. |
| 8,083,364 | B2 | 12/2011 | Allen |
| 8,096,668 | B2 | 1/2012 | Abu-Ageel |
| 8,419,249 | B2 * | 4/2013 | Yatsuda et al. ................ 362/545 |
| 2004/0052076 | A1 | 3/2004 | Mueller et al. |
| 2006/0002108 | A1 | 1/2006 | Ouderkirk et al. |
| 2006/0002110 | A1 | 1/2006 | Dowling et al. |
| 2006/0164005 | A1 | 7/2006 | Sun |
| 2006/0164607 | A1 | 7/2006 | Morejon et al. |
| 2006/0285193 | A1 | 12/2006 | Kimura et al. |
| 2007/0013871 | A1 | 1/2007 | Marshall et al. |
| 2007/0188847 | A1 | 8/2007 | McDonald et al. |
| 2007/0241340 | A1 | 10/2007 | Pan |
| 2008/0062644 | A1 | 3/2008 | Petroski |
| 2008/0143973 | A1 | 6/2008 | Wu |
| 2008/0198572 | A1 | 8/2008 | Medendorp |
| 2008/0232084 | A1 | 9/2008 | Kon |
| 2009/0059099 | A1 | 3/2009 | Linkov et al. |
| 2009/0059585 | A1 | 3/2009 | Chen et al. |
| 2009/0128781 | A1 | 5/2009 | Li |
| 2009/0232683 | A1 | 9/2009 | Hirata et al. |
| 2009/0262516 | A1 | 10/2009 | Li |
| 2010/0006762 | A1 | 1/2010 | Yoshida et al. |
| 2010/0061068 | A1 | 3/2010 | Geissler et al. |
| 2010/0061078 | A1 | 3/2010 | Kim |
| 2010/0103389 | A1 | 4/2010 | McVea et al. |
| 2010/0202129 | A1 | 8/2010 | Abu-Ageel |
| 2010/0231863 | A1 | 9/2010 | Hikmet et al. |
| 2010/0244700 | A1 | 9/2010 | Chong et al. |
| 2010/0302464 | A1 | 12/2010 | Raring et al. |
| 2010/0315320 | A1 | 12/2010 | Yoshida |
| 2010/0320928 | A1 | 12/2010 | Kaihotsu et al. |
| 2010/0321641 | A1 | 12/2010 | Van Der Lubbe |
| 2010/0321933 | A1 | 12/2010 | Hatanaka et al. |
| 2011/0051453 | A1 | 3/2011 | Nagasawa et al. |
| 2011/0188241 | A1 * | 8/2011 | Walczak et al. ............... 362/235 |

OTHER PUBLICATIONS

H. A El-Shaikh, S. V. Garimella, "Enhancement of Air Jet Impingement Heat Transfer using Pin-Fin Heat Sinks", D IEEE Transactions on Components and Packaging Technology, Jun. 2000, vol. 23, No. 2.

J. Y. San, C. H. Huang, M. H, Shu, "Impingement cooling of a confined circular air jet", In t. J. Heat Mass Transf. , 1997. pp. 1355-1364, vol. 40.

N. T. Obot, W. J. Douglas, A S. Mujumdar, "Effect of Semi-confinement on Impingement Heat Transfer", Proc. 7th Int. Heat Transf. Conf., 1982, pp. 1355-1364. vol. 3.

S. A Solovitz, L. D. Stevanovic, R. A Beaupre, "Microchannels Take Heatsinks to the Next Level", Power Electronics Technology, Nov. 2006.

Yongmann M. Chung, Kai H. Luo, "Unsteady Heat Transfer Analysis of an Impinging Jet", Journal of Heat Transfer—Transactions of the ASME, Dec. 2002, pp. 1039-1048, vol. 124, No. 6.

* cited by examiner

SEALED ELECTRICAL DEVICE WITH COOLING SYSTEM AND ASSOCIATED METHODS

RELATED APPLICATIONS

This application is a continuation in part of U.S. patent application Ser. No. 13/107,782 titled Sound Baffling Cooling System for LED Thermal Management and Associated Methods filed on May 13, 2011, the entire contents of which are incorporated herein by reference. This application is also related to U.S. patent application Ser. No. 12/775,310 titled Low Profile Light filed on May 6, 2010, which, in turn, claims the benefit of U.S. Provisional Patent Application Ser. No. 61/248,665 filed on Oct. 5, 2009, the entire contents of each of which are incorporated herein by reference.

FIELD OF THE INVENTION

The present invention relates to the fields of lighting and, more specifically, to cooling devices for digital devices in a sealed environment, and associated methods.

BACKGROUND OF THE INVENTION

Cooling systems for digital devices have traditionally employed a heat sink thermally coupled to the digital device. In some other systems, a fan has also been employed to direct a flow of air through the heat sink, thereby accelerating the dissipation of heat from the heat sink and, therefore, from the digital device.

However, traditional cooling systems for digital devices have also relied upon a supply of relatively cool air from the environment to blow onto and transfer heat away from the digital device. As a result, proposed solutions in the prior art have included vents, apertures, or other openings generally into the housing of the digital device to provide a supply of cool air from the environment.

The introduction of air from the environment into the housing of a digital device may also results in the introduction of contaminants. Substances carried along with the environmental air can inhibit and impair the operation of the digital device, causing faulty performance by or early failure of the digital device. Moreover, the accumulation of contaminants in the cooling system can result in a reduction in efficacy of the cooling system. Accordingly, there is a need in the art for a cooling system that can operate in a system sealed from the environment, hence without a supply of air external the sealed system.

Sealed cooling systems are known in the art. As an example, a Peltier device can be used to cool a digital system without a supply of external air. However, Peltier devices are expensive to produce and use electricity inefficiently in comparison to more traditional cooling systems. Accordingly, there is a need for a cooling system in a sealed environment that is inexpensive to produce and is energy efficient.

Other proposed solutions have included the use of a sealed system containing a fluid thermally coupled to the digital device in association with a radiator where fluid warmed by the digital device radiates the heat into the environment. However, these systems require significant amounts of space in order to pipe the fluid between the radiator and the thermal coupling with the digital device. Accordingly, there is a need for a cooling system that can operate in a space-limited sealed system.

SUMMARY OF THE INVENTION

With the foregoing in mind, the present invention advantageously provides a cooling system for a digital device that can operate in a sealed system, and that is inexpensive to install and energy efficient. Additionally, the present invention does not rely on voluminous radiators and, hence, can operate in a space-limited system.

These and other objects, features, and advantages according to the present invention are provided by an electrical device operable to dissipate heat and capable of maintaining a thermal equilibrium of at least a portion of the electrical device. The electrical device according to an embodiment of the present invention may include a heat generating element, a heat sink in thermal contact with the heat generating element, and a fluid flow generator. The electrical device may also include an enclosure enclosing the fluid flow generator and at least a portion of the heat sink so that a fluid contained within the enclosure is confined within the interior volume of the enclosure, thereby sealing the system.

The heat generating element may be a light source, and the light source may be a light emitting diode (LED) package. The LED package may include an LED and a circuit board functionally coupled to the LED.

The interior volume of the enclosure of the electrical device, according to an embodiment of the present invention may be proportional to the thermal energy generated by the heat generating element. Further, a surface of the enclosure may be proportional to the thermal output of the heat generating element. The heat sink may be a micro-channel heat sink including fins, which may, in some embodiments, be curved.

The enclosure of the electrical device according to an embodiment of the present invention may include an optic. The enclosure may be configured to include a base member with a sidewall, an attaching member with a sidewall and an optic receiving section. The sidewalls of the base member and the attaching member may connect to each other and form a fluid seal. Additionally, the heat generating element may be attached to the enclosure at the optic receiving section. Furthermore, the optic may be carried by the enclosure at the optic receiving section. In such embodiments, the base member may be generally circular, the attaching member may be generally annular, and the optic may be generally circular and may have a generally concave geometry. Moreover, in some embodiments, the enclosure may include a wire portal having an aperture and a sealing member.

The fluid flow generator may generate a fluid flow within the enclosure such that the fluid transfers thermal energy from the heat sink to the enclosure. In some embodiments, the fluid flow generator may include a micro-blower. The fluid flow generator may create a fluid flow with a variable rate, wherein the fluid flow rate varies with the thermal energy of the heat generating element.

The system, according to an embodiment of the present invention, may advantageously maintain a portion of the electrical device at a thermal equilibrium. The various elements of the system may be configured towards maintaining the thermal equilibrium. In some embodiments, the thermal equilibrium may be 25 degrees Celsius.

In another embodiment, the present invention may be provided by a lighting fixture comprising an electronic lighting apparatus including a light source, a heat sink adjacent the light source, a fluid flow generator, and a support. The support may be attached at one end to the fluid flow generator and at a second end to the heat sink, thereby offsetting the fluid flow generator from the heat sink.

Embodiments of the present invention may further include an enclosure disposed about the electronic lighting apparatus, defining an interior volume as an enclosed area. The electronic lighting apparatus may be carried by the enclosure and at least partially within the enclosed area. Furthermore, the electronic lighting apparatus may interface with the enclosure to form a seal about the enclosed area, thereby confining a fluid to the interior volume.

The present invention may also include a method for using any of the devices described hereinabove. The method may include the steps of operating the light source and actuating the fluid flow generator to create a fluid flow. The method may further comprise the steps of determining an approximate thermal output of the light source, determining an approximate fluid flow rate necessary to maintain a temperature of at least a portion of the light source within a temperature range, and actuating the fluid flow generator at a rate sufficient to generate the determined fluid flow rate.

DETAILED DESCRIPTION OF THE PREFERRED EMBODIMENT

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

In this detailed description of the present invention, a person skilled in the art should note that directional terms, such as “above,” “below,” “upper,” “lower,” and other like terms are used for the convenience of the reader in reference to the drawings. Also, a person skilled in the art should notice this description may contain other terminology to convey position, orientation, and direction without departing from the principles of the present invention.

Figure 1A:
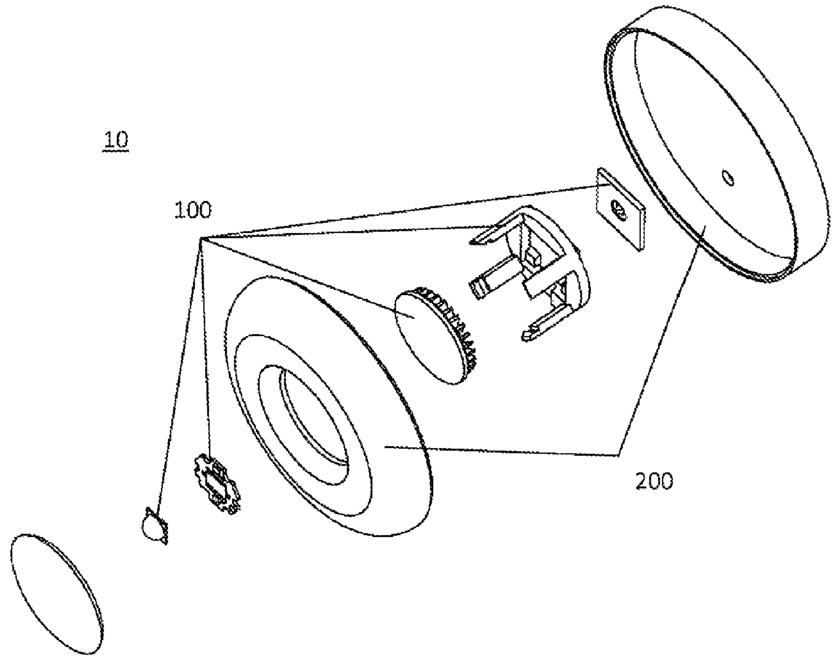
FIG. 1A is an exploded perspective view of an electric device according to an embodiment of the present invention including an enclosure.
Figure 1B:
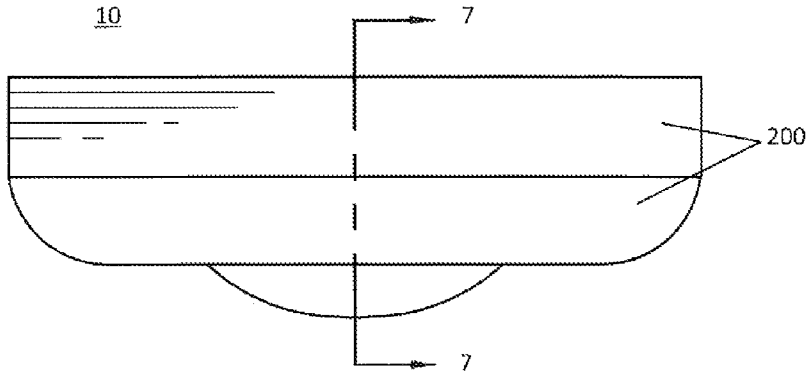
FIG. 1B is an assembled, profile view of the electrical device depicted in FIG. 1A.
Figure 2:
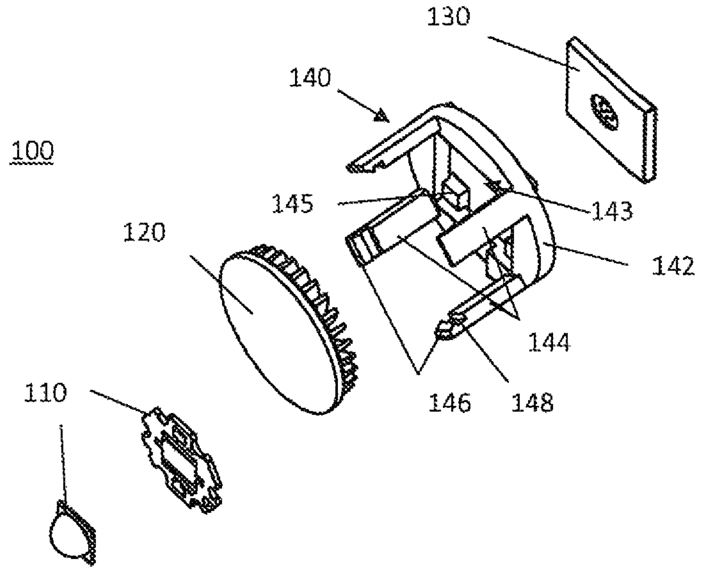
FIG. 2 is an exploded perspective view of a lighting apparatus according to an embodiment of the present invention.

Referring now to FIGS. 1A-2, an electrical device 10 operable to dissipate heat according to an embodiment of the present invention is now described in greater detail. Throughout this disclosure, the electrical device 10 may also be referred to as a device, lighting device, light fixture, or the invention. Alternate references of the electrical device 10 in this disclosure are not meant to be limiting in any way.

Referring now to FIG. 1A, an electrical device 10 including a heat generating element in the form of an electronic lighting apparatus 100 and an enclosure 200 will now be discussed. Referring additionally to FIG. 2, the electronic lighting apparatus 100, according to an embodiment of the present invention may include a light source 110, a heat sink 120, and a fluid flow generator 130. The heat sink 120 may be positioned adjacent the light source 110, and the fluid flow generator 1.30 may be positioned in some proximity to the heat sink 120.

Still referring to FIG. 2, the fluid flow generator 130 may be a device capable of creating a flow of fluid. The fluid flow generator 130 may have a low profile, reducing the overall profile of the electronic lighting apparatus 100. For instance, and by way of example only and without limitation, the fluid flow generator 130 may be a micro-blower. The configuration of the micro-blower may be made according to the disclosure of references incorporated herein. Additional details of low profile lights that may incorporate certain aspects of the present invention are found in U.S. Published Patent Application No. 2011/0080727 titled “Low Profile Light,” the entire contents of which is incorporated herein by reference.

Furthermore, the fluid flow generator 130 may operate at a variable rate. As a result, the fluid flow generated by the fluid flow generator 130 will vary accordingly, resulting in a variable fluid flow rate. To provide a sufficient, and not excessive, amount of heat dispersion capacity, the operation rate of the fluid flow generator 130 may be varied to generate a fluid flow rate suitable to maintain at least a portion of the electrical device 10 within a temperature range or at a thermal equilibrium, described in greater detail hereinbelow.

Continuing to refer to FIG. 2, the fluid flow generator 130 may be carried by a support 140. The support 140 may be configured to carry the fluid flow generator 130 at some distance away from the heat sink 120. Furthermore, the support 140 may further be configured to carry the fluid flow generator 130 in a certain position and orientation such that the operation of the fluid flow generator 130 is controlled. For instance, and not by way of limitation, the support 140 may carry the fluid flow generator 130 such that the fluid flow generator 130 may create a fluid flow in the direction of the heat sink 120. In the present embodiment, the support 140 may include a pedestal 142 that is configured to attach to and support the fluid flow generator 130. In some embodiments, the pedestal 142 may include an aperture 143 that facilitates the operation of the fluid flow generator 130, permitting a fluid flow therethrough. To facilitate carrying the fluid flow generator 130, the support 140 may include one or more projecting members 145 projecting from the pedestal 142 into an area generally below the aperture 143. The projecting members 145 may be configured to carry and support the fluid flow generator 130, permitting the fluid flow:generator 130 to interface with and rest atop the projecting members 145.

The support 140 may further include a plurality of legs 144 attached to and extending generally away from the pedestal 142. The plurality of legs 144 of the embodiment of the invention illustrated in the appended figures includes four legs. Those skilled in the art will readily appreciate that other embodiments may have any number of legs to provide sufficient structural support and stability to maintain the relative positions of the heat sink 120 and the fluid flow generator 130. Each of the plurality of legs 144 may include a tapered section 146 and a catch 148 that facilitates the attachment of the support 140 to a supporting element. In the present embodiment, the support 140 may attach to the heat sink 120. Those skilled in the art, however, will readily appreciate that this is merely one configuration of the support 140, and that the support may be configured in any number of ways suitable for positioning the fluid flow generator a suitable distance and in a suitable orientation from the heat sink 120 to dissipate heat from the heat generating elements, i.e., the light source 110, to the enclosure.

In alternate embodiments of the present invention, the electrical device 10 may be provided without use of a support 140, wherein the fluid flow generator 130 instead interfaces directly with the heat sink 120. In such embodiments, the fluid flow generator 130 may be attached to the heat sink 120 by any method capable of preventing movement of the fluid flow generator 130 with respect to the heat sink 120. Such methods include, without any intent to limit attachment methods to this list, adhesives, glues, fasteners, latches, and any other method known in the art.

Figure 3:
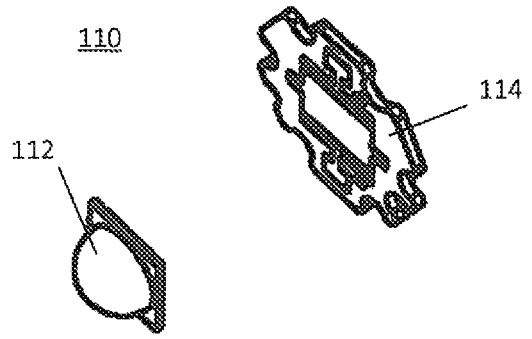
FIG. 3 is a perspective view of a light emitting diode (LED) package of the lighting apparatus illustrated in FIG. 2.

Referring now to FIG. 3, a light source 110 according to an embodiment of the present invention is now discussed in greater detail. The light source 110 may include any device capable of emitting light. These lights may, for example and without limitation, include incandescent lights, halogens, fluorescents (including compact-fluorescents), high-intensity discharges, light emitting diodes (LEDs), lasers, and any other light-emitting device known in the art. In some embodiments of the present invention, the light source 110 is an LED package. Referring to FIG. 3, where the light source 110 is an LED package, the LED package may include an LED 112 and a circuit board 114. The circuit board 114 is configured to be functionally coupled to the LED 112.

Referring now to FIG. 2, the heat sink 120 is positioned adjacent the light source 110. Furthermore, the heat sink 120 may be thermally coupled to the light source 110. This thermal coupling may be accomplished by any method, including thermal adhesives, thermal pastes, thermal greases, thermal pads, and all other methods known in the art. Where a thermal adhesive, paste, or grease is used, the heat sink 120 may be connected to any part of the light source 110 as may effectively cause thermal transfer between the light source 110 and the heat sink 120. This will largely depend on the heat distribution within the light source 110. For example, the heat sink 120 may be thermally coupled to the LED 112, the circuit board 114, or both. The method and location of thermal coupling may be selected based on criteria including ease of application/installation, thermal conductivity, chemical stability, structural stability, and constraints placed by the electrical device 10.

Figure 4:
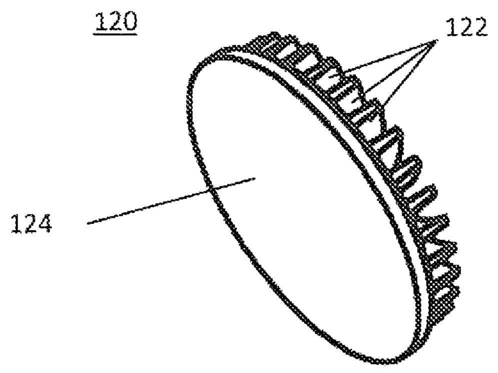
FIG. 4 is a perspective view of a heat sink of the lighting apparatus illustrated in FIG. 2.

Referring now to FIG. 4, the heat sink 120 of the electrical device 10, according to an embodiment of the present invention is discussed in greater detail. The heat sink 120 may be a micro-channel heat sink including a number of fins 122 configured to provide a larger surface area than may otherwise be provided by the surface of the light source 110. The configuration of the fins 122 may be configured according to the direction of the incorporated references. The illustrated embodiment shows the plurality of fins 122 being curved to advantageously provide additional surface area to provide additional dissipation of heat. Those skilled in the art will readily appreciate, however, that the fins 122 of the heat sink 120 may be configured in any way while still accomplishing the many goals, features and advantages according to the present invention.

Further, the heat sink 120 may include a base plate 124 from which the fins 122 project. The base plate 124 may be configured to cooperate with the tapered sections 146 and catches 148 of the plurality of legs 144 (shown in FIG. 2), permitting the support 140 to attach thereto. The base plate 124 may be configured into any shape, including a circle, ovoid, square, rectangle, triangle, or any other polygon. The heat sink 120 may be made of a thermally conductive material. Materials include, without limitation, metals, metal alloys, carbon allotropes, ceramics, and composite materials. Accordingly, and as may be understood by those skilled in the art, the heat sink 120 advahtageously provides additional surface area for heat that may be produced to be dissipated.

Figure 5:
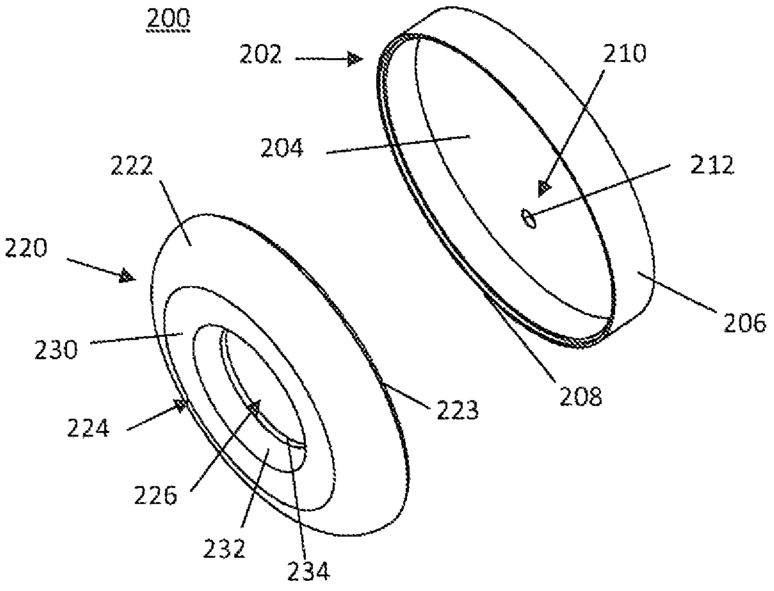
FIG. 5 is a perspective view of an enclosure of the lighting apparatus illustrated in FIG. 2.

Referring now to FIG. 5, the electrical device 10 includes an enclosure 200. The enclosure 200 may be configured to define an interior volume. The interior volume may be isolated from the environment such that fluid from the environment is not able to gain entry to the interior volume and intermix with the fluid contained therein. Hence, a fluid seal is created about the interior volume of the enclosure 200. Types of fluid contained by the enclosure may be liquid or gaseous.

The interior volume of the enclosure 200 may be configured to have spatial characteristics permitting fluid flow within the interior volume. The fluid flow within the interior volume causes the transfer of heat from the electrical device 10 to the enclosure 200, which then transfers the heat to the environment. Referring additionally to FIG. 1A, the heat is transferred from the electrical device 10 to the heat sink 120 and, in turn, due to the fluid flow created by the fluid flow generator 130, to the interior volume of the enclosure 200 and, thereafter, to the environment. Accordingly, the spatial characteristics of the interior volume directly corresponds to the amount of heat that can be transported from the electrical device 10 to the environment. Spatial characteristics that can be modified include total volume, fluid flow characteristics, interior surface area, and exterior surface area. For example, and without limitation, one or more surfaces of the enclosure 200 may be textured or include grooves to increase the surface area of the surface, thereby facilitating thermal transfer thereto. As another example, again without limitation, the enclosure 200 may include generally rounded interior surfaces reducing the aerodynamic profile of the enclosure 200, thereby reducing drag experienced by fluid flowing therein. Moreover, thermal properties of the materials used to form the enclosure 200 may be considered in forming the enclosure 200.

The aforementioned spatial characteristics may be modified to accommodate the heat generated by the heat generating element of the electrical device. Accordingly, a heat generating element with a relatively high amount of heat generation may have a first enclosure configured to accommodate a high amount of heat dissipation, and a heat generating element with a relatively low amount of heat generation may have a second enclosure configured to accommodate a low amount of heat dissipation. For instance, the volume of the interior volume may be directly proportional to the thermal output of the electrical device 10. Similarly, a surface area of some part of the enclosure 200 may be proportional to the thermal output of the electrical device 10. In any case, the interior volume may be configured to maintain the temperature of the electrical device at thermal equilibrium or within a target temperature range. For instance, and without limitation, the thermal equilibrium may be 25 degrees Celsius, or the upper limit on the target temperature range may be 25 degrees Celsius.

Continuing to refer to FIG. 5, the enclosure 200 may include a base member 202. The base member 202 includes a base 204 and a sidewall 206, the sidewall 206 projecting from a surface of the base 204. The base member 202 may be formed into any shape, including a circle, ovoid, square, rectangle, triangle, or any other polygon.

The sidewall 206 may be configured to project generally orthogonally from the surface of the base 204 at the perimeter thereof, although the sidewall 206 may be configured to project from the base 204 at any angle. The sidewall 206 further includes a projecting member 208 formed in a thickness of the sidewall 206. The projecting member 208 may be configured to facilitate the formation of a fluid seal, described in detail hereinbelow.

Still referring to FIG. 5, the enclosure 200 may include a wire portal 210. The wire portal 210 is configured to permit wiring connected to devices at least partially contained within the enclosure 200 to exit the enclosure 200. In the present embodiment, the wire portal 210 is disposed on the base member 202. Other embodiments may have the wire portal 210 disposed on other parts of the enclosure 200. The wire portal 210 may include an aperture 212 of sufficient diameter to permit the aforementioned wires to pass therethrough. In order to maintain a fluid seal between the interior volume and the environment, the wire portal 210 may further include a sealing member. The sealing member may include any device or material that can provide a fluid seal as described above. For example, and without limitation, the sealing member may include an adhesive disposed about wires passing through the aperture 212, forming a fluid seal in the space between the wires and the aperture 212.

Continuing to refer to FIG. 5, the enclosure 200 may further include an attaching member 220. The, attaching member 220 may include a sidewall 222 and an optic receiving portion 224. The sidewall 222 may have a generally curved shape and may include a ledge 223 extending generally away from the sidewall 222. The ledge 223 may be configured to cooperate with the projecting member 208 to form a fluid seal therebetween. A fluid seal may be formed between the ledge 223 and the projecting member 208 by any suitable method, including interference fit, use of adhesives, gasket, or any other method known in the art. Moreover, methods of forming a fluid seal between the sidewall 206 of the base member 202 and the sidewall 222 of the attaching member 210 aside from those disclosed hereinabove are contemplated by the invention.

The optic receiving section 224 may attach to the sidewall 222. The optic receiving section 224 is configured to define an aperture 226. The aperture 226 may be configured to be centered at a longitudinal axis of the attaching member 220. The aperture 226 may be defined by a series of walls included in the optic receiving section 224. The first wall 230 may be generally parallel to the base 204 of the base member 202. The second wall 232 may have a curved shape and may extend generally away from the first wall 230. The third wall 234 may extend from the second wall 232 and be generally parallel to the base 204 of the base member 202. Moreover, the third wall 234 may attach to and form a seal with a part of the electronic lighting apparatus 100. The first wall 230, second wall 232, and third wall 234, taken with the sidewall 222, may give the attaching member 220 a generally annular shape, with the aperture 226 forming the void of the annular shape.

Figure 6:
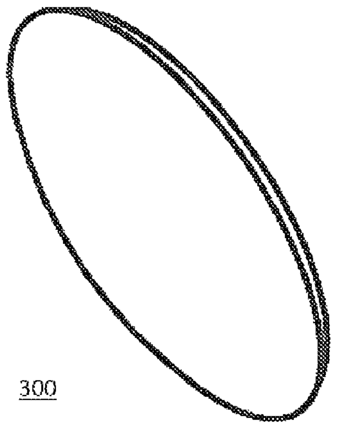
FIG. 6 is a perspective view of an optic of the lighting apparatus illustrated in FIG. 2.

As illustrated in FIG. 6, an optic 300 is provided according to an embodiment of the present invention. The optic 300 may be configured to interact with light emitted by the light source 110 to refract incident light. Accordingly, the light source 110 may be disposed such that light emitted therefrom is incident upon the optic 300. The optic 300 may be formed in any shape to impart a desired refraction. In the present embodiment, the optic 300 has a generally concave geometry. The optic 300 may further be formed so as to cooperate with the optic receiving section 224, enabling the optic 300 to be carried by the optic receiving section 224. Furthermore, the optic 300 may be formed of any material with transparent or translucent properties that comport with the desired refraction to be performed by the optic 300.

Figure 7:
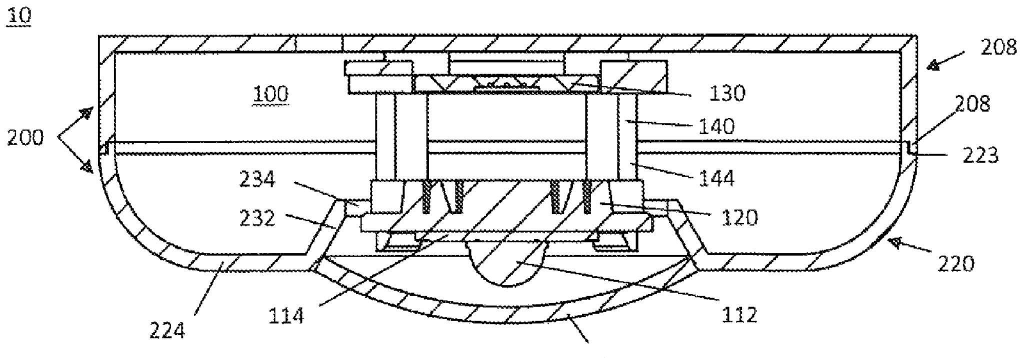
FIG. 7 is a cross sectional view of the electrical device illustrated in FIG. 1B taken through line 7-7.

Referring now to FIG. 7, the electrical device 10 as shown in FIGS. 1-6 is in an assembled state, and the illustration represents a cross sectional view of the assembled electrical device. The projecting member 208 of the base member 202 interfaces with the ledge 223 of the attaching member 220 to attach the base member 202 to the attaching member 220, forming a fluid seal therebetween. The electronic lighting apparatus 100 may be disposed at least partially within the interior volume defined by the enclosure 200. In the present embodiment, at least portions of the heat sink 120, fluid flow generator 130, and support 140 are disposed within the interior volume.

As noted above, the third wall 234 may attach to a portion of the electronic lighting apparatus 100. The attachment may create a fluid seal, which, in conjunction with the fluid seal formed between the base member 202 and the attaching member 220, forms a complete fluid seal and isolates the interior volume from the environment. In the present embodiment, the third wall 234 may interface with at least one of the heat sink 120 and the support 140, specifically the plurality of legs 144. In order to form a fluid seal between the third wall 234 and the electronic lighting apparatus 100, a sealing member may be used. Types of sealing members included are adhesives, gaskets, interference fits, and any other method of forming a seal known in the art.

In the present configuration, the LED 112 and the circuit board 114 are substantially outside the sealed interior volume. Additionally, the optic 300 is also substantially outside the sealed interior volume. The optic 300 may interface with the optic receiving section 224 to attach to and be carried by the attachment member 220. Specifically, the optic 300 may form an interference fit with the second wall 232, the interference fit providing sufficient strength to carry the optic 300 thereby. Optionally, the optic 300 may be attached to the optic receiving section 224 through the use of an adhesive, glue, or any other attachment method known in the art.

In order to facilitate the transmission of heat from the heat generating element to the surface of the enclosure 200, various aspects of the electrical device 10 may be configured to direct the flow of fluid within the enclosure 200 from the fluid flow generator 130 to the heat sink 120, then to a surface of the enclosure 120. Accordingly, the fluid flow generator 120 may be positioned so as to direct a flow of fluid at the heat sink 120. As shown in the embodiment of the invention depicted in FIG. 7, the fluid flow generator 130 is positioned above the heat sink 120. Furthermore, the fluid flow generator 130 may be positioned to cooperate with micro-channels that may be present in the heat sink 120. In the present embodiment, and in accordance with a configuration of the heat sink 120 as described in references incorporated herewith, the fluid flow generator 130 may direct a flow fluid directly down into the micro-channels of the heat sink 120, wherein the fluid flows through the micro channels and is directed laterally outward from the heat sink 120. The continuous flow of fluid caused by the fluid flow generator 130 may create a circulatory flow of fluid within the enclosure 200, wherein fluid that has been heated by contact with the heat sink 120 is circulated to various spaces within the interior volume of the enclosure 200.

A method of operating an electrical device substantially as described above is also included within the scope of the invention. One method of use includes the operation of the heat generating element. In some embodiments, the heat generating element is a light source. The operation of the heat generating element causes the creation of heat within the electrical device. The heat sink is placed adjacent to the heat generating element, and may further be thermally coupled to the heat generating element to facilitate the transmission of heat from the heat generating to the heat sink.

The method of use further includes the actuation of the fluid flow generator. The actuation of the fluid flow generator causes a fluid sealed within the enclosure to flow within the enclosure. The flow of fluid comes into contact with the heat sink. The fluid may contact any part of the heat sink, including, depending on the configuration of the heat sink, a base, a fin, or movement of fluid through a micro-channel of the heat sink. The contact between the heat sink and the fluid causes the transfer of heat from the heat sink to the fluid.

The flow of the fluid causes the heated fluid to move out of contact with the heat sink and into another space within the interior volume of the enclosure. While the heated fluid is moving, it is continuously transferring heat to non-heated fluid contained within the enclosure that the heated fluid may come into contact with. Additionally, should heated fluid come into contact with a surface of the enclosure, the heated fluid may transfer heat to that surface.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A lighting fixture comprising:
- an electronic lighting apparatus comprising:
  - a light source;
  - a heat sink positioned adjacent to the light source;
  - a fluid flow generator; and
  - a support configured to attach at a first end to the fluid flow generator and at a second end to the heat sink to offset the fluid flow generator from the heat sink and to permit fluid to be directed to the heat sink; and
- an enclosure disposed about the electronic lighting apparatus to define an interior volume as an enclosed area;
- wherein the electronic lighting apparatus is carried by the enclosure and at least partially within the enclosed area; and
- wherein the electronic lighting apparatus interfaces with the enclosure to form a seal about the enclosed area thereby confining a fluid to the interior volume of the enclosure.

2. A lighting fixture according to claim 1 wherein the light source is a light emitting diode (LED) package.

3. A lighting fixture according to claim 2 wherein the LED package includes an LED and a circuit board functionally connected to the LED.

4. A lighting fixture according to claim 2 wherein the LED package is thermally coupled to the heat sink.

5. A lighting fixture according to claim 1 wherein the interior volume is proportional to a thermal output of the light source.

6. A lighting fixture according to claim 5 wherein the interior volume is configured to have spatial characteristics permitting fluid flow therewithin to maintain a temperature of the light source within a defined range.

7. A lighting fixture according to claim 6 wherein an upper limit of the temperature range does not exceed 25 degrees Celsius.

8. A lighting fixture according to claim 1 wherein a surface area of the enclosure is proportional to a thermal output of the light source.

9. A lighting fixture according to claim 1 wherein the heat sink is a micro-channel heat sink including fins.

10. A lighting fixture according to claim 9 wherein the fins are curved.

11. A lighting fixture according to claim 1 further comprising an optic to be carried by the enclosure; and wherein the light source is configured to emit light in a direction that is incident upon the optic.

12. A lighting fixture according to claim 11 wherein the enclosure further comprises:
- a base member comprising a base surface and a sidewall; and
- an attaching member comprising a sidewall and an optic receiving section;
- wherein the sidewall of the base member is configured to connect to and form a fluid seal with the sidewall of the attaching member;
- wherein a portion of the electronic lighting apparatus is configured to attach to and form a fluid seal with the optic receiving section; and
- wherein the optic is adapted to be carried by the optic receiving section.

13. A lighting fixture according to claim 12 wherein the base member is generally circular and the attaching member is generally annular.

14. A lighting fixture according to claim 12 wherein the optic has a generally concave geometry.

15. A lighting fixture according to claim 1 wherein the enclosure comprises a wire portal having an aperture and a sealing member.

16. A lighting fixture according to claim 1 wherein fluid flow created by the fluid flow generator has a variable rate to define a variable fluid flow rate, the variable fluid flow rate varying with a thermal output of the light source.

17. A lighting fixture according to claim 1 wherein the fluid is gaseous.

18. A lighting fixture according to claim 1 wherein the fluid flow generator is provided by a micro-blower.

19. A lighting fixture comprising:
- an electronic lighting apparatus comprising:
  - a light emitting diode (LED) package comprising an LED and a circuit board;
  - a micro-channel heat sink comprising fins, the heat sink being positioned adjacent to the LED package and being thermally coupled to the LED package;
  - a fluid flow generator; and
  - a support configured to attach at a first end to the fluid flow generator and at a second end to the heat sink to offset the fluid flow generator from the heat sink and to permit fluid to be directed to the heat sink; and
- an enclosure disposed about the electronic lighting apparatus to define an interior volume as an enclosed area, the interior volume being proportional to thermal output of the LED and being configured to have spatial characteristics permitting fluid flow therewithin to maintain a temperature of the LED package within a defined range;
- wherein the electronic lighting apparatus is carried by the enclosure and at least partially within enclosed area; and
- wherein the electronic lighting apparatus interfaces with the enclosure to form a seal about the enclosed area.

20. A lighting fixture according to claim 19 wherein a surface area of the enclosure is proportional to the thermal output of the light source.

21. A lighting fixture according to claim 19 wherein an upper limit of the defined range does not exceed 25 degrees Celsius.

22. A lighting fixture according to claim 19 wherein the fins are curved.

23. A lighting fixture according to claim 19 further comprising an optic to be carried by the enclosure; and wherein the LED is configured to emit light in a direction that is incident upon the optic.

24. A lighting fixture according to claim 19 wherein the enclosure further comprises:

a base member comprising a base surface and a sidewall; and an attaching member comprising a sidewall and an optic receiving section;

wherein the sidewall of the base member is configured to connect to and form a fluid seal with the sidewall of the attaching member;

wherein a portion of the electronic lighting apparatus is configured to attach to and form a fluid seal with the optic receiving section; and wherein an optic is adapted to be carried by the attaching member by the optic receiving section.

25. A lighting fixture according to claim 24 wherein the base member is generally circular and the attaching member is generally annular; and wherein the optic has a generally concave geometry.

26. A lighting fixture according to claim 19 wherein the enclosure comprises a wire portal having an aperture and a sealing member.

27. A lighting fixture according to claim 19 wherein the fluid flow created by the fluid flow generator has a variable rate to define a variable fluid flow rate, the variable fluid flow rate varying with thermal output of the light source.

28. A lighting fixture according to claim 19 wherein the fluid is gaseous.

29. A lighting fixture according to claim 19 wherein the fluid flow generator is provided by a micro-blower.

30. An electrical device operable to dissipate heat and capable of maintaining a thermal equilibrium of at least a portion of the electrical device comprising:

a heat generating element;

a heat sink in thermal contact with the heat generating element;

a fluid flow generator; and an enclosure enclosing the fluid flow generator and the heat sink so that a fluid contained within the enclosure is substantially confined to an interior volume defined by the enclosure;

wherein the fluid flow generator is operable to generate a fluid flow incident upon the heat sink such that the fluid flow within the enclosure transfers thermal energy from at least a portion of the heat sink to at least of portion of the enclosure.

31. An electrical device according to claim 30 wherein the heat generating element is a light source.

32. An electrical device according to claim 31 wherein the light source is a light emitting diode (LED) package including an LED and a circuit board functionally coupled to the LED.

33. An electrical device according to claim 30 wherein the interior volume is proportional to the thermal energy generated by the heat generating element.

34. An electrical device according to claim 30 wherein a surface area of the enclosure is proportional to the thermal energy generated by the heat generating element.

35. An electrical device according to claim 30 wherein the fluid flow generator is a micro-blower.

36. An electrical device according to claim 30 wherein the heat sink is a micro-channel heat sink including fins; and wherein the fins are curved.

37. An electrical device according to claim 30 further comprising an optic to be carried by the enclosure.

38. An electrical device according to claim 30 wherein the enclosure further comprises:

a base member comprising a base surface and a sidewall; and an attaching member comprising a sidewall and an optic receiving section;

wherein the sidewall of the base member is configured to connect to and form a fluid seal with the sidewall of the attaching member;

wherein a portion of the heat generating element is configured to attach to and form a fluid seal with the optic receiving section; and wherein an optic is adapted to be carried by the optic receiving section.

39. An electrical device according to claim 38 wherein the base member is generally circular; wherein the attaching member is generally annular; and wherein the optic has a generally concave geometry.

40. An electrical device according to claim 30 wherein the enclosure comprises a wire portal having an aperture and a sealing member.

41. An electrical device according to claim 30 wherein the fluid flow created by the fluid flow generator has a variable rate to define a variable fluid flow rate, the variable fluid flow rate varying with thermal energy of the heat generating element.

42. An electrical device according to claim 30 wherein the thermal equilibrium is maintained at about 25 degrees Celsius.

43. A method of providing fluid flow within an enclosure to cool interior portions of a light fixture that includes an electronic lighting apparatus comprising a light source, a heat sink positioned adjacent to the light source and within the enclosure, a fluid flow generator, and a support configured to attach at a first end to the fluid flow generator and at a second end to the heat sink to offset the fluid flow generator from the heat sink and to permit fluid to be directed to the heat sink, the method comprising:

operating the light source; and actuating the fluid flow generator to create a fluid flow that is incident upon the heat sink;

wherein the fluid flow is contained within the enclosure that is sealed to define an interior volume as an enclosed area;

wherein the electronic lighting apparatus is carried by the enclosure and at least partially within the enclosed area; and wherein the electronic lighting apparatus interfaces with the enclosure to form a seal about the enclosed area.

44. A method according to claim 43 wherein the light source is a light emitting diode (LED) package that includes an LED and a circuit board functionally connected to the LED; wherein the LED package is thermally coupled to the heat sink.

45. A method according to claim 43 wherein the interior volume of the enclosed area is proportional to a thermal output of the light source; and wherein the interior volume of the enclosed area is configured to have spatial characteristics permitting fluid flow therewithin to sufficiently cool the thermal output of the light source.

46. A method according to claim 43 wherein a surface area of the enclosure is proportional to a thermal output of the light source.

47. A method according to claim 43 wherein the enclosure comprises a base member comprising a base surface and a sidewall; and an attaching member comprising a wall and an optic receiving section; wherein the sidewall of the base member is configured to connect to and form a fluid seal with the sidewall of the attaching member; wherein a portion of the electronic lighting apparatus is configured to attach to and form a fluid seal with the optic receiving section; and wherein the optic is adapted to be carried by the attaching member by the optic receiving section.

48. A method according to claim 43 wherein the step of actuating the fluid flow generator further comprises the steps of:

determining an approximate thermal output of the light source;

determining an approximate fluid flow rate necessary maintain a temperature of at least a portion of the light source within a temperature range; and actuating the fluid flow generator at a rate sufficient to generate the determined fluid flow rate.

49. A method according to claim 48, wherein the upper limit of the temperature range is about 25 degrees Celsius.

50. A method according to claim 43 wherein the heat sink is a micro-channel heat sink comprising fins; and wherein the micro-channel heat sink is configured to optimally direct the heated fluid flow about the interior volume of the enclosed area.

* * * * *